United States Patent [19]
Raasch

[11] Patent Number: 5,717,565
[45] Date of Patent: Feb. 10, 1998

[54] EASILY CHANGEABLE NOTEBOOK KEYBOARD

[75] Inventor: Charles F. Raasch, Lake Forest, Calif.

[73] Assignee: AST Research, Inc., Irvine, Calif.

[21] Appl. No.: 569,649

[22] Filed: Dec. 8, 1995

[51] Int. Cl.$^6$ .................................................. G06F 1/16
[52] U.S. Cl. ........................... 361/680; 200/511; 361/683
[58] Field of Search .................................... 361/680, 683, 361/684, 686, 760, 767, 776, 789; 364/708.1, 709.1; 200/511; 174/68.1, 69, DIG. 9; G06F 1/16

[56] References Cited

U.S. PATENT DOCUMENTS

| | | | |
|---|---|---|---|
| 5,087,825 | 2/1992 | Ingraham | 200/511 |
| 5,175,398 | 12/1992 | Hofmann | 174/169 |
| 5,355,278 | 10/1994 | Hosoi et al. | 361/680 |
| 5,543,787 | 8/1996 | Karidis et al. | 341/20 |
| 5,572,399 | 11/1996 | Shirato et al. | 361/680 |

OTHER PUBLICATIONS

IBM Technical Disclosure Bulletin, "Keyboard Switch With Stroke And Feedback Enhancement Using Vertically Conducting Elastomer in A Laterally Conducting Mode", S.F. Kambic, Oct. 1977.

*Primary Examiner*—Lynn D. Feild
*Attorney, Agent, or Firm*—Knobbe, Martens, Olson & Bear, LLP

[57] ABSTRACT

Circuits and methods for providing electrical communication between the keyboard and PC board of a notebook computer, and notebook computers employing such circuits and methods. A plurality of contacts electrically coupled to a keyboard and a plurality of contacts electrically coupled to a PC board are brought into electrical communication when the keyboard engages or is mounted to a housing or a PC board of the notebook. In presently preferred embodiments, physical contact may be provided between the two sets of contacts or an elastomeric material, or other type of bridge circuit, may be used to provide electrical connectivity between the two sets of contacts.

12 Claims, 4 Drawing Sheets

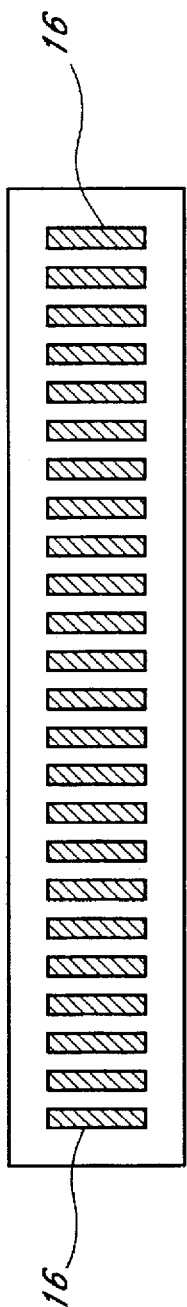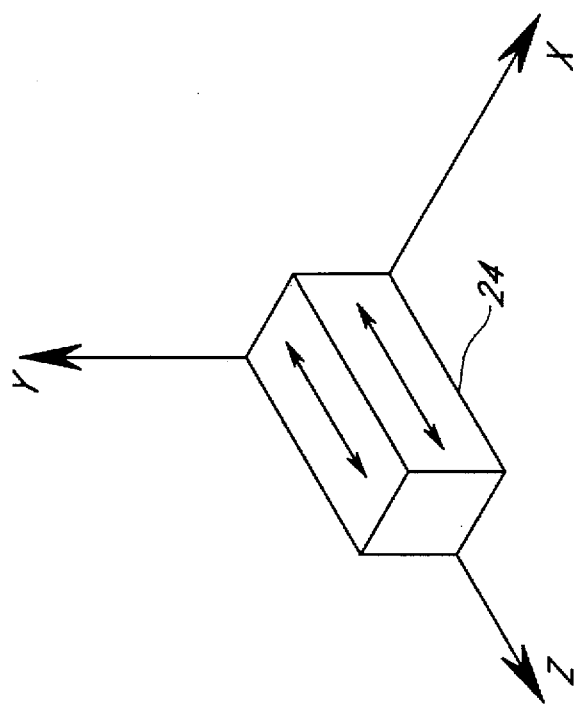
Fig. 2a
Fig. 2b

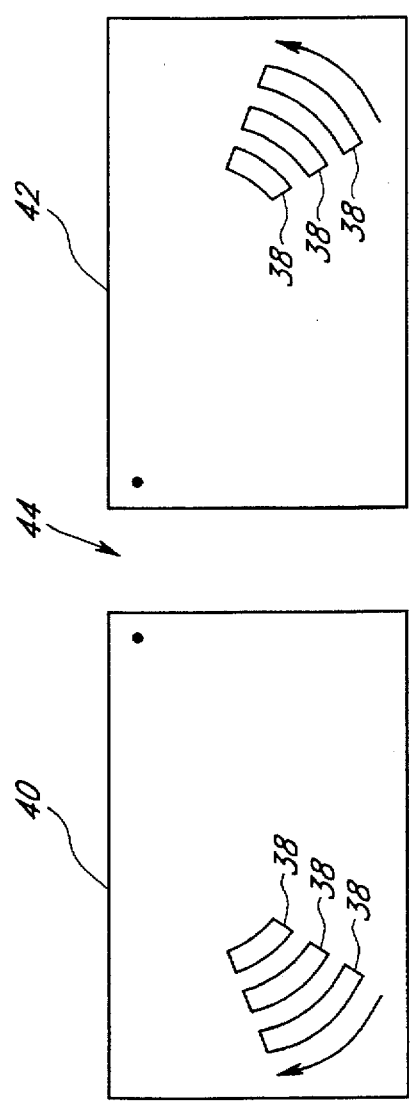
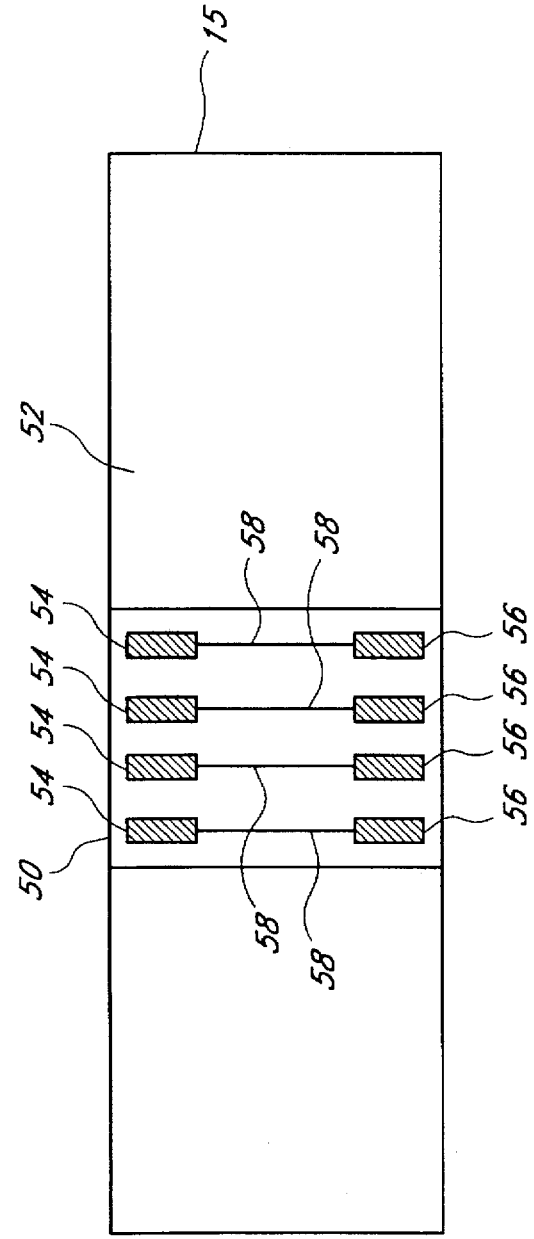
Fig. 3c
Fig. 4

EASILY CHANGEABLE NOTEBOOK KEYBOARD

BACKGROUND OF THE INVENTION

The present invention relates generally to notebook computer systems and, more particularly, to systems, methods and circuits for providing an electrical connection between a keyboard, trackpad or other device and one or more PC boards of a notebook computer.

A substantial problem which is faced by numerous manufacturers of notebook computers is the problem of foreign market forecasting. More specifically, it is difficult to predict the number of notebook computers which will be demanded by a given foreign market in any defined period, and it is costly to disassemble and reconfigure notebook computers, which have been manufactured for one market, so that those notebook computers may be sold in a different market. One major reason for this is that notebooks which are sold in different markets often require different keyboards. For example, if a notebook computer is initially manufactured and configured for sale in England, that notebook computer will be assembled with a keyboard applicable to the English market. The same would apply for a notebook assembled for the French market. It follows that, if it becomes necessary to fill a French order for notebook computers with notebook computers originally destined for the English market, the keyboards of the notebooks originally destined for England will need to be exchanged for keyboards applicable to the French market. This exchange is often costly, as it requires substantial time to implement.

As those skilled in the art will appreciate, the keyboards and PC boards of notebook computers are generally connected via cables of wire or mylar (often referred to as "tails". Generally, the cables, which extend from and often comprise an integral component of a keyboard, are fastened into connectors disposed on the surface of a PC board. Because the fasteners and connectors used to couple the cables to PC boards are often disposed in difficult to reach locations and are, in many cases, fragile and difficult to use, installing or replacing the keyboard of a notebook computer can be a time consuming and expensive task.

Given the extremely narrow profit margins which exist within the notebook computer manufacturing industry, and given the large numbers of notebook computers which are sold worldwide each year, it is clear that many computer manufacturers would find improved circuits, systems and methods for installing and exchanging notebook computer keyboards to be highly desirable.

SUMMARY OF THE INVENTION

The present invention is directed to improved systems, circuits and methods for providing an electrical connection between a keyboard and PC board of a notebook computer, and to improved systems and methods for installing and exchanging the keyboards of notebook computers.

In one particularly innovative aspect, an interconnect circuit in accordance with the present invention provides an electrical connection between the keyboard and PC board of a notebook computer without utilizing conventional cables or "tails."

In one embodiment, an elastomeric material provides an electrical interconnection between a plurality of electrical contacts coupled to a keyboard and a plurality of electrical contacts coupled to a PC board. For example, an elastomeric material may be disposed between the keyboard and a PC board of a notebook computer and provide an electrical connection between a plurality of electrical contacts provided on, for example, the bottom surface of the keyboard and the top surface of a surface mount device (SMD) pad disposed on the PC board.

In another embodiment, the contacts coupled to the keyboard and PC board may be configured to provide a direct physical connection when the keyboard is attached to the housing of the notebook, or when the keyboard is coupled directly to a PC board, thus eliminating the need to utilize an elastomeric or other type of bridge circuit. This embodiment may have particular utility in the area of expandable or moveable keyboards. For example, it may be desirable to provide a plurality of arcuate contact pads on the base of a keyboard and to provide a plurality of point contacts on a PC board, thus allowing the contacts on the keyboard and PC board to maintain electrical connection, for example, when two separate sections of the keyboard are rotated from one position to another.

In still another embodiment, the keyboard and PC board of a notebook computer may be interconnected by a bridge circuit provided on a selected wall of the housing of the notebook computer.

Accordingly, it is an object of the present invention to provide improved circuits, systems and methods for providing an electrical connection between the keyboard and PC board of a notebook computer.

It is also an object of the present invention to provide improved circuits, systems and methods for exchanging the keyboards of various notebook computers.

It is still another an object of the present invention to provide improved notebook computers which employ innovative techniques to provide electrical contact between their keyboards and PC boards.

BRIEF DESCRIPTION OF THE DRAWINGS

FIG. 2(a) is an illustration of a set of contacts which may be disposed on a surface of a keyboard and a surface of a PC board in accordance with one form of the present invention.

FIG. 2(b) illustrates the electrically conductive properties of an elastomeric material with respect to a three-dimensional axis.

FIGS. 3(b) and 3(c) illustrate a first and second embodiment of a set of contacts which may be disposed on a surface of a keyboard to provide sliding contact with a second set of contacts disposed, for example, on a PC board or notebook housing in accordance with another form of the present invention.

FIG. 4 illustrates a bridge circuit which may be used to provide electrical connectivity between a set of electrical contacts provided on a keyboard and a set of electrical contacts provided on a PC board of a notebook computer in accordance with the present invention.

DESCRIPTION OF THE PREFERRED EMBODIMENTS

Figure 1:
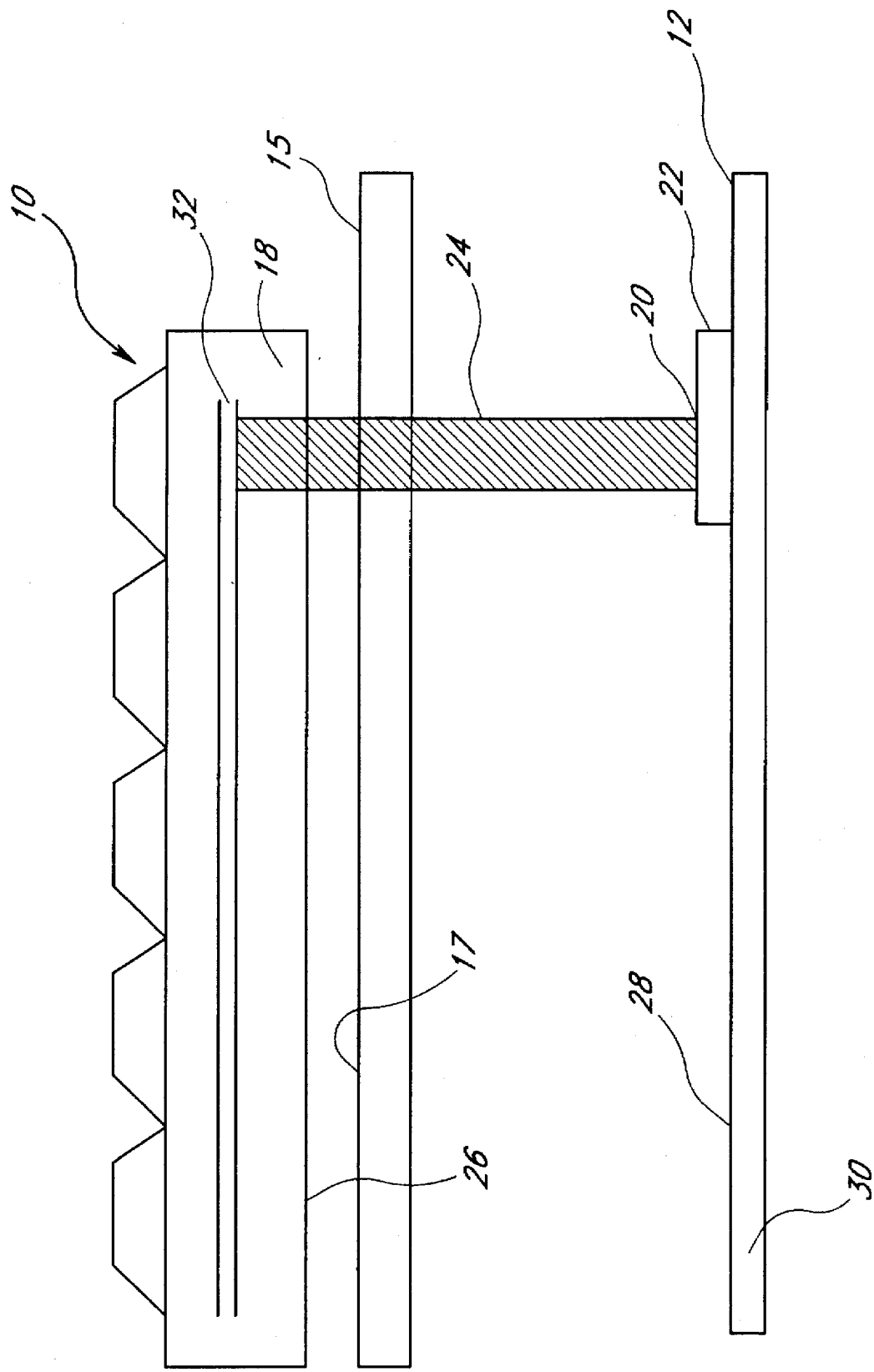
FIG. 1 is an illustration of a notebook computer keyboard and PC board which are interconnected by an elastomeric strip in accordance with one form of the present invention.

Turning now to the drawings, FIG. 1 illustrates one embodiment of a new and innovative technique for providing an electrical interconnection between the keyboard 10 and PC board 12 of a notebook computer. A plurality of electrical contacts 16 (shown in FIG. 2(a)) are provided on, for example, a back surface 18 of a keyboard 10 and an upper surface 20 of a surface mount device (SMD) pad 22 disposed on a PC board 12. An elastomeric material 24 is disposed and provides electrical connectivity between the keyboard 10 and PC board 12. Thus, electrical connectivity between the contacts 16 of the keyboard 10 and the PC board 12 may be established upon the attachment of the keyboard 10 to the housing 15 of the notebook, i.e., when the contacts 16 of the keyboard 10 and the PC board 12 are forced against the elastomeric material 24. Alternatively, electrical connectivity between the contacts 16 of the keyboard 10 and the PC board 12 may be established when the keyboard 10 is mounted to the PC board 12, again causing the contacts 16 of the keyboard 10 and PC board 12 to be forced against the elastomeric material 24. Elastomeric materials, such as that described above, may be purchased, for example, from Amp, Inc., of Harrisburg, Pa.

Where the keyboard 10 and PC board 12 of a notebook computer are interconnected in the manner described above (or as described elsewhere herein), the use of mylar cable fasteners may be eliminated, and substantial efficiencies both in the initial manufacture of notebook computers and in the exchange of notebook computer keyboards may be achieved.

Those skilled in the art will appreciate that, because the elastomeric material 24 only conducts electricity along its "z" axis (as shown in FIG. 2(b)), the electrical contacts 16 of the keyboard 10 and the PC board 12 may be arranged in any of numerous orientations, all of which are considered to be equivalent and interchangeable in the context of the present invention. For example, the electrical contacts 16 might be disposed upon the bottom surface 26 of the keyboard 10 and the top surface 28 of the PC board 12, or the electrical contacts 16 might be disposed on respective back surfaces 18 and 30 of the keyboard 10 and PC board 12. In still another embodiment, the electrical contacts 16, which are coupled to the PC board 12, might be disposed on a surface 17 of the housing 15 of the notebook computer, and the elastomeric material 24 might be disposed between the housing 15 and keyboard 10.

As for the electrical contacts 16, it is presently preferred that these contacts comprise exposed metal or conductive ink contacts, and that, in the case of the keyboard 10, the contacts 16 be formed on a printed circuit board (PCB) (not shown) or a mylar sheet 32, such as that illustrated in FIG. 1. However, those skilled in the art will appreciate that numerous other types of electrical contacts exist and could be used interchangeably with those described herein.

Figure 3A:
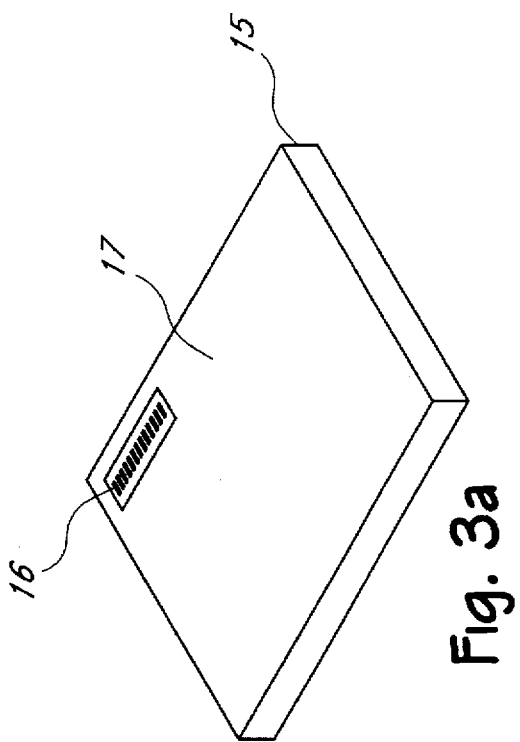
FIG. 3(a) is an illustration of a set of contacts which may be disposed on a surface of a keyboard and a surface of a PC board or notebook housing in accordance with the present invention.

Turning now to FIG. 3(a), in an alternative embodiment which does not employ an elastomeric material, the contacts 16 coupled to the keyboard 10 and the PC board 12 may be brought into physical contact, when the keyboard 10 is mounted to the housing 15 or PC board 12 of the notebook computer. In this embodiment, the contacts 16 coupled to the PC board 12 may be disposed, for example, on the external surface 17 of the housing 15 of the notebook computer, and both physical and electrical contact between the contacts 16 of the keyboard 10 and the PC board 12 may be established when the keyboard 10 is mounted to the housing 15 of the notebook computer. The coupling of keyboards to the housings of notebook computers is considered to be well known in the art and, therefore, is not discussed in detail herein.

Figure 3B:
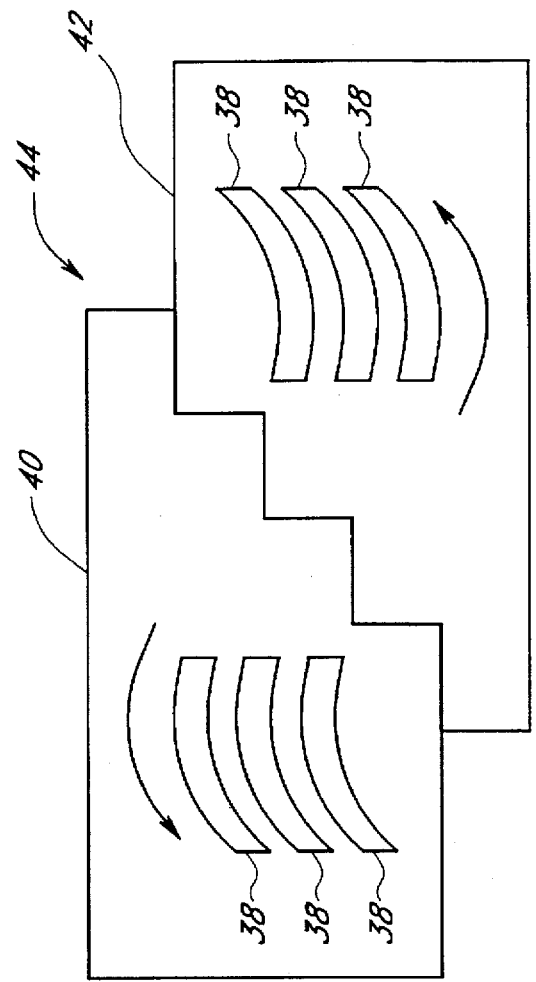

As shown in FIGS. 3(b) and 3(c) this embodiment may have particular utility in the area of expandable or moveable keyboards. For example, it may be desirable to provide a plurality of arcuate contact pads 38 on separate base portions 40 and 42 of a split keyboard 44 and to provide a plurality of point contacts 16 on the housing 15 of the notebook (or, alternatively, on the PC board 12 of the notebook), thus allowing the contact pads 38 on the split keyboard 44 and the contacts 16 on the housing 15 (or PC board 12) to maintain electrical connection, for example, when the two sections 40 and 42 of the keyboard 44 are rotated from one position to another.

In still another embodiment shown in FIG. 4, a bridge circuit 50 may be employed to provide electrical communication between the electrical contacts 16 of the keyboard 10 and PC board 12. For example, in one preferred form the bridge circuit 50 may be disposed against a back or side wall 52 of the housing 15 of the notebook computer, and the electrical contacts 16 of the keyboard 10 and the PC board 12 may be forced against respective sets of contacts 54 and 56 provided on the bridge circuit 50 as the keyboard 10 and PC board 12 are mounted in the housing 15. Further, in a particularly innovative aspect of this embodiment, the EMF shielding (not shown) disposed in the housing 15 of the notebook computer may be used to provide the bridge circuit 50. The shielding is modified such that two sets of contacts 54 and 56 are provided on the surface of the shielding and a set of circuit lines 58 interconnecting the two sets of contacts 54 and 56 are provided in a selected layer of the shielding. A bridge circuit 50 of this type may be manufactured using conventional masking techniques, which are well known in the shielding art.

While the invention is susceptible to various modifications and alternative forms, specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. A circuit for providing an electrical connection between a keyboard and a PC board of a notebook computer, said circuit comprising:

a plurality of electrical contacts formed on a selected surface of said keyboard;

a plurality of electrical contacts formed on a selected surface of said PC board; and an electrically conductive elastomeric material providing an electrical interconnection between said contacts of said keyboard and said contacts of said PC board.

2. The circuit of claim 1, wherein said contacts of said keyboard and said contacts of said PC board are metal contacts.

3. The circuit of claim 1, wherein said contacts of said keyboard and said PC board are ink contacts.

4. The circuit of claim 1, wherein said contacts of said PC board are formed on a surface mount device (SMD) pad disposed on said PC board.

5. A circuit for providing an electrical connection between a keyboard and a PC board of a notebook computer, said circuit comprising:

a first plurality of contacts electrically coupled to said keyboard;

a second plurality of contacts electrically coupled to said PC board; and an electrically conductive elastomeric material providing an electrical interconnection between said contacts coupled to said keyboard and said contacts coupled to said PC board.

6. A notebook computer comprising:

a keyboard having a selected surface whereon a plurality of electrical contacts are provided;

a PC board; and a housing, said housing having a selected surface whereon a plurality of electrical contacts are provided, said electrical contacts being in electrical communication with said PC board; and said housing providing a mounting for said PC board and being adapted to engage said keyboard, said electrical contacts of said keyboard and said housing being brought into electrical communication when said housing engages said keyboard.

7. The notebook computer of claim 6, further comprising an elastomeric strip which is disposed between said housing and said keyboard and provides electrical communication between said electrical contacts of said keyboard and said housing when said housing engages said keyboard.

8. The notebook computer of claim 6, wherein said housing is adapted to be mounted in a casing of said notebook computer.

9. The notebook computer of claim 6, wherein said housing comprises a casing of said notebook computer.

10. A notebook computer comprising:

a keyboard having a first plurality of electrical contacts provided thereon;

a PC board adapted to engage said keyboard and having a second plurality of electrical contacts provided on a selected surface thereof, said PC board having an electrically conductive elastomeric material disposed on said selected surface, said electrical contacts of said keyboard and said PC board being brought into electrical communication via said elastomeric material when said PC board engages said keyboard; and a housing providing a mount for said keyboard and said PC board.

11. A method for providing an electrical connection between a keyboard and a PC board of a notebook computer, said method comprising the steps of:

providing a first plurality of contacts which are electrically coupled to said keyboard;

providing a second plurality of contacts which are electrically coupled to said PC board; and disposing an electrically conductive elastomeric material between said first and second pluralities of contacts such that said elastomeric material provides an electrical interconnection between said first and second pluralities of contacts.

12. A notebook computer comprising:

a keyboard having a selected surface whereon a plurality of electrical contacts are provided;

a PC board having a selected surface whereon a plurality of electrical contacts are provided;

a housing, said housing providing a mounting for said PC board and said keyboard; and an electrically conductive elastomeric strip disposed between keyboard and said PC board, said electrical contacts of said keyboard and said PC board being brought into electrical communication via said elastomeric strip when said housing engages said keyboard.

* * * * *